(12) United States Patent
Zhang

(10) Patent No.: US 12,021,525 B2
(45) Date of Patent: Jun. 25, 2024

(54) RECEIVER, MEMORY AND TESTING METHOD

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 207 days.

(21) Appl. No.: 17/652,039

(22) Filed: Feb. 22, 2022

(65) Prior Publication Data

US 2023/0019429 A1 Jan. 19, 2023

Related U.S. Application Data

(63) Continuation of application No. PCT/CN2021/120314, filed on Sep. 24, 2021.

(30) Foreign Application Priority Data

Jul. 16, 2021 (CN) .......................... 202110808712.6

(51) Int. Cl.
*H03K 19/018* (2006.01)
*H03F 3/45* (2006.01)
(Continued)

(52) U.S. Cl.
CPC ... *H03K 19/01855* (2013.01); *H03F 3/45179* (2013.01); *H03F 3/45183* (2013.01); *H03K 5/082* (2013.01); *H03K 5/2481* (2013.01)

(58) Field of Classification Search
CPC ............. H03K 19/01855; H03K 5/082; H03K 5/2481; H03F 3/45179; H03F 3/45183;
(Continued)

(56) References Cited

U.S. PATENT DOCUMENTS 7,123,046 B2 * 10/2006 Keeth .................. G11C 7/1078
326/26
7,298,130 B2 * 11/2007 Komatsu ................. G06F 11/24
714/E11.154

(Continued)

FOREIGN PATENT DOCUMENTS

CN 101312344 A 11/2008
CN 100501864 C 6/2009
(Continued)

OTHER PUBLICATIONS

First Office Action of the Taiwanese application No. 111124065, issued on Mar. 28, 2023.
(Continued)

*Primary Examiner* — Vibol Tan
(74) *Attorney, Agent, or Firm* — SYNCODA LLC; Feng Ma

(57) ABSTRACT

A receiver includes the following: a signal receiving circuit, including a first MOS transistor and a second MOS transistor, where a gate of the first MOS transistor is configured to receive a reference signal and a gate of the second MOS transistor is configured to receive a data signal, and the signal receiving circuit is configured to output a comparison signal, the comparison signal being configured to represent a magnitude relationship between a voltage value of the reference signal and a voltage value of the data signal; and an adjusting circuit, including a third MOS transistor, where a source of the third MOS transistor is connected to a source of the first MOS transistor, a drain of the third MOS transistor is connected to a drain of the first MOS transistor, and a gate of the third MOS transistor is configured to receive an adjusting signal.

15 Claims, 5 Drawing Sheets

(51) Int. Cl.
  *H03K 5/08* (2006.01)
  *H03K 5/24* (2006.01)
  *H03K 19/0185* (2006.01)

(58) Field of Classification Search
  CPC .......... H03F 2203/45352; G11C 7/065; G11C 7/1084; G11C 7/1087; G11C 29/021; G11C 29/026; G11C 29/12005; G11C 29/1201; G11C 29/028; G11C 29/022; G06F 11/22; G06F 11/277; G06F 11/2273; G06F 11/25; G06F 11/263
  See application file for complete search history.

(56) References Cited

U.S. PATENT DOCUMENTS

| | | | |
|---|---|---|---|
| 8,648,582 B2 | 2/2014 | Huang | |
| 10,075,141 B1 | 9/2018 | Nagulapalli | |
| 10,411,707 B1* | 9/2019 | Lee | H03F 3/45183 |
| 10,902,892 B2* | 1/2021 | Tsukada | G11C 29/24 |
| 11,705,167 B2* | 7/2023 | Zhang | G11C 7/222 |
| | | | 365/203 |
| 11,790,959 B2* | 10/2023 | Ji | G11C 7/08 |
| | | | 365/207 |
| 11,791,804 B2* | 10/2023 | Liu | H03K 3/012 |
| | | | 327/356 |
| 2003/0153140 A1 | 8/2003 | Keeth | |
| 2006/0255831 A1 | 11/2006 | Keeth | |
| 2006/0255990 A1 | 11/2006 | Keeth | |
| 2012/0105047 A1 | 5/2012 | Huang | |
| 2018/0351524 A1 | 12/2018 | Nagulapalli et al. | |
| 2021/0013850 A1 | 1/2021 | Cui et al. | |

FOREIGN PATENT DOCUMENTS

| | | | |
|---|---|---|---|
| CN | 205811971 U | 12/2016 | |
| CN | 205945656 U | 2/2017 | |
| CN | 106026979 B | 1/2019 | |
| EP | 4037184 A1 * | 8/2022 | ............. H03F 1/301 |
| TW | 201733271 A | 9/2017 | |

OTHER PUBLICATIONS

Supplementary European Search Report in the European application No. 21884129.4, issued on May 3, 2023.

International Search Report in the international application No. PCT/CN2021/120314, mailed on Mar. 1, 2022.

\* cited by examiner

RECEIVER, MEMORY AND TESTING METHOD

CROSS-REFERENCE TO RELATED APPLICATIONS

This is a continuation of International Application No. PCT/CN2021/120314 filed on Sep. 24, 2021, which claims priority to Chinese Patent Application No. 202110808712.6 filed on Jul. 16, 2021. The disclosures of these applications are hereby incorporated by reference in their entirety.

BACKGROUND

During a process of product design, signal integrity simulation and testing are required to be performed on a memory, i.e., inspection and verification are required in terms of signal quality and signal time sequence.

An important step in memory testing is a Rank Margining Test (RMT). Parameters obtained by the RMT test include TxV− and TxV+ used for representing a maximum window where a data signal can be correctly recognized by a data receiver along a voltage direction. In case of high speed, due to deterioration of the data signal quality, the maximum window represented by the parameters above would be shrunk. To enlarge the maximum window, Continuous Time Linear Equalizer (CTLE) and Decision Feedback Equalization (DFE) equalizers are generally adopted.

SUMMARY

Embodiments of the disclosure relate to, but limited to, a receiver, a memory, and a testing method.

Embodiments of the disclosure provide a receiver, including: a signal receiving circuit, including a first Metal-Oxide-Semiconductor (MOS)transistor and a second MOS transistor, where a gate of the first MOS transistor is configured to receive a reference signal and a gate of the second MOS transistor being configured to receive a data signal, and the signal receiving circuit is configured to output a comparison signal, the comparison signal being configured to represent a magnitude relationship between a voltage value of the reference signal and a voltage value of the data signal; and an adjusting circuit, including a third MOS transistor, where a source of the third MOS transistor is connected to a source of the first MOS transistor, a drain of the third MOS transistor is connected to a drain of the first MOS transistor, and a gate of the third MOS transistor is configured to receive an adjusting signal.

The embodiments of the disclosure further provide a memory including a receiver. The receiver includes a signal receiving circuit, including a first Metal-Oxide-Semiconductor (MOS)transistor and a second MOS transistor, where a gate of the first MOS transistor is configured to receive a reference signal and a gate of the second MOS transistor being configured to receive a data signal, and the signal receiving circuit is configured to output a comparison signal, the comparison signal being configured to represent a magnitude relationship between a voltage value of the reference signal and a voltage value of the data signal; and an adjusting circuit, including a third MOS transistor, where a source of the third MOS transistor is connected to a source of the first MOS transistor, a drain of the third MOS transistor is connected to a drain of the first MOS transistor, and a gate of the third MOS transistor is configured to receive an adjusting signal.

The embodiments of the disclosure further provide a testing method, including: providing a receiver, where the receiver includes a signal receiving circuit including a first Metal-Oxide-Semiconductor (MOS) transistor and a second MOS transistor, and an adjusting circuit including a third MOS transistor; controlling the third MOS transistor to be turned off; inputting a data signal to a signal receiving circuit and adjusting, according a first step length, a voltage value of a reference signal to obtain multiple comparison signals designated as first comparison signals; where in response to that a magnitude relationship represented by the comparison signals is the same as a magnitude relationship between the data signal and the reference signal, where the comparison signals are taken as effective signals; obtaining a voltage value range, designated as a first voltage value range, of the reference signal corresponding to all of the effective signals of the first comparison signals; and obtaining an intermediate value and a minimal value of the first voltage value range, where the minimal value is taken as a first minimal value; inputting the data signal to the signal receiving circuit and adjusting, according to the first step length, a voltage value of the reference signal and in response to that a voltage value of the reference signal is less than or equal to the intermediate value, inputting an adjusting signal to make the third MOS transistor to be turned on, to obtain multiple comparison signals designated as second comparison signals; and obtaining a voltage value range, designated as a second voltage value range, of the reference signal corresponding to all of the effective signals of the second comparison signals; and obtaining a minimum value of the second voltage value range, where the minimum value is taken as a second minimal value.

BRIEF DESCRIPTION OF THE DRAWINGS

One or more embodiments are exemplarily illustrated by the corresponding drawings. These exemplary descriptions do not limit the embodiments, and elements with the same reference numbers in the drawings are designated as similar elements. Unless otherwise stated, the pictures in the drawings do not limit the scale.

DETAILED DESCRIPTION

In order to make the objectives, technical solutions, and advantages of the embodiments of the disclosure clearer, each embodiment of the disclosure will be described below in detail in combination with the drawings. However, one of ordinary skill in the art may understand that, in each embodiment of the disclosure, many technical details are proposed to make readers understand the disclosure better. However, the technical solutions claimed by the disclosure may also be implemented even without these technical details and various variations and modifications made based on each of the following embodiment.

Figure 1:
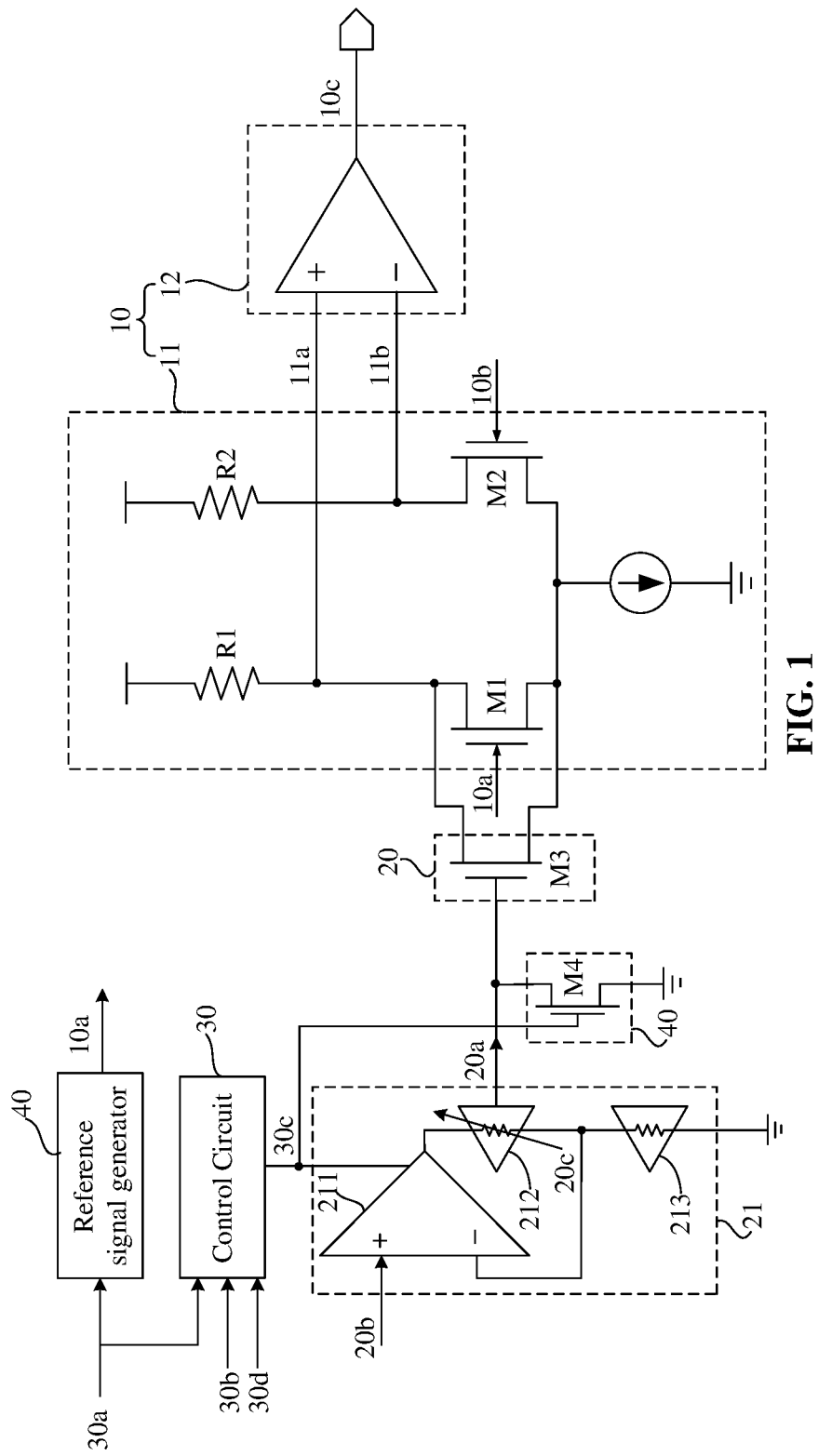
FIG. 1 is a schematic structural diagram of a receiver according to an embodiment of the present disclosure.
Figure 2:
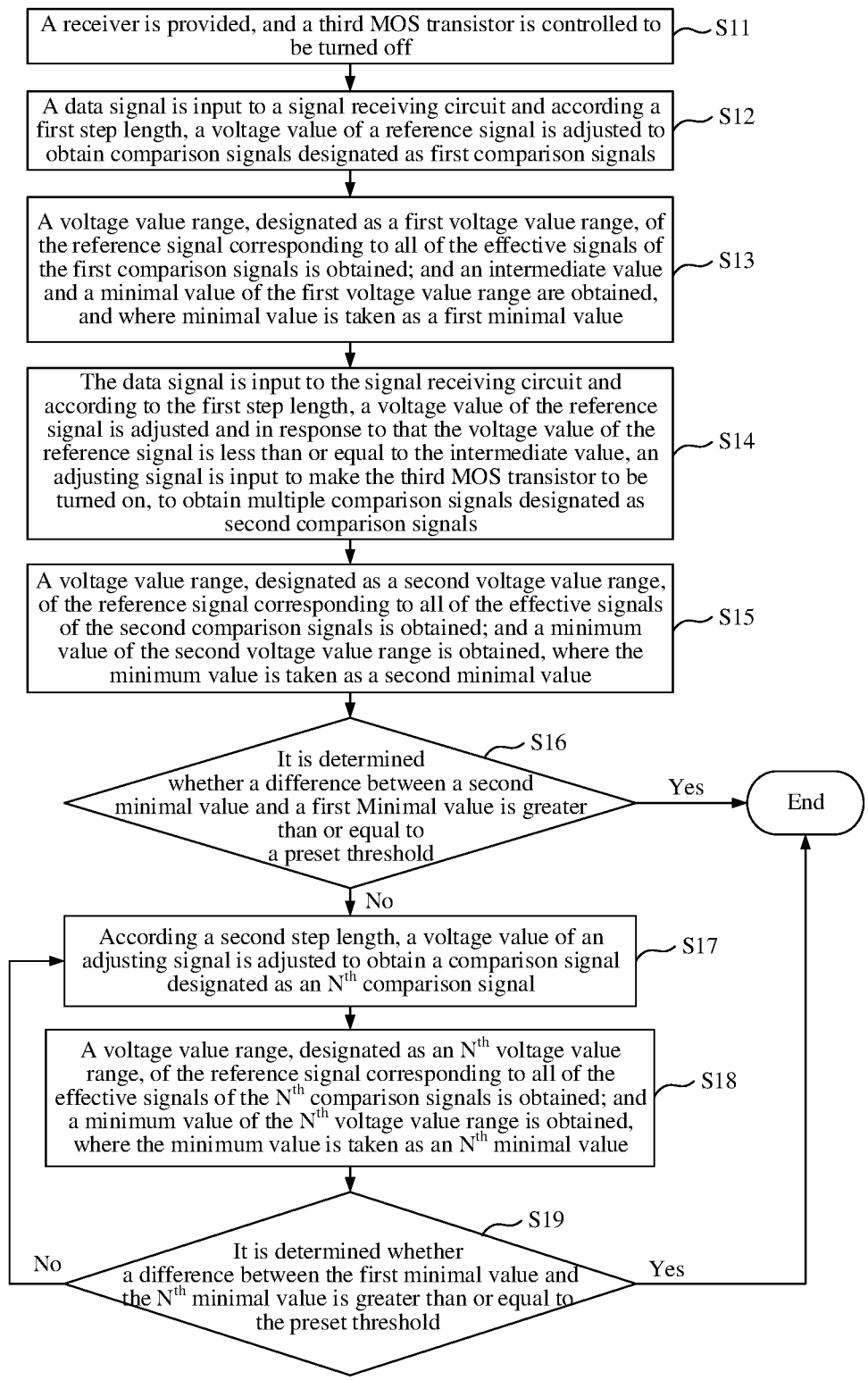
FIG. 2 is a testing method according to an embodiment of the present disclosure.

With reference to FIG. 1, the receiver includes: a signal receiving circuit 10, including a first MOS transistor M1 and a second MOS transistor M2, where a gate of the first MOS transistor M1 is configured to receive a reference signal 10a and a gate of the second MOS transistor M2 being configured to receive a data signal 10b, and the signal receiving circuit 10 is configured to output a comparison signal 10c, the comparison signal 10c being configured to represent a magnitude relationship between a voltage value of the reference signal 10a and a voltage value of the data signal 10b; and an adjusting circuit 20, including a third MOS transistor M3, where a source of the third MOS transistor M3 is connected to a source of the first MOS transistor M1, a drain of the third MOS transistor M3 is connected to a drain of the first MOS transistor M1, and a gate of the third MOS transistor M3 is configured to receive an adjusting signal 20a.

In some embodiments, a ratio between a width-to-length ratio of the first MOS transistor M1 and a width-to-length ratio of the third MOS transistor M3 is greater than 4. In this way, it facilitates to enable the third MOS transistor M3 to only has a fine-tuning function, and prevent the setting of the third MOS transistor M3 from weakening or even partially disabling the function of the first MOS transistor M1, which makes the first MOS transistor M1 to be mainly in charge of the adjustment of the voltage value of the reference signal 10a.

In some embodiments, the adjusting circuit 20 further includes: an adjusting sub-circuit 21, configured to receive an external signal 20b and adjusting codes 20c to output the adjusting signal 20a, where the external signal 20b is used for generating the adjusting signal 20a; and each of the adjusting codes 20c corresponding to a respective voltage value of the adjusting signal 20a. Under the condition that the parameters of the third MOS transistor M3 are determined and the voltage values of the adjusting signal 20a are determined, the conduction degree of the third MOS transistor M3 is determined; under the condition that a circuit structure connected to the third MOS transistor M3 is determined, the conduction degree of the third MOS transistor M3 corresponds to a conductive current. That is to say, each adjusting code 20c corresponds to a respective conductive current of the third MOS transistor M3.

Specifically, the adjusting sub-circuit 21 includes: an operational amplifier 211 and multiple resistors connected in series (not shown), where the operational amplifier 211 has a non-inverting input terminal, an inverting input terminal and an output terminal, the non-inverting input terminal being configured to receive the external signal 20b, first resistor sub-circuits 212 being connected in series between the inverting input terminal and the output terminal, the first resistor sub-circuits 212 includes a first number of resistors connected in series, second resistors sub-circuits 213 being connected in series between the inverting input terminal and a ground terminal, and the second resistor sub-circuits 213 includes a second number of resistors connected in series; and a variable resistance sub-circuit (not shown), configured to receive the adjusting codes 20c and control, according to the adjusting codes 20c, the gate of the third MOS transistor M3 to be connected to a distal ground terminal of one of the first or second number of resistors. It should be noted that each resistor has a proximal ground terminal and a distal ground terminal. If a current passes through the resistor, a voltage of the distal ground terminal is greater than a voltage of the proximal ground terminal. In addition, the first number and the second number are natural numbers greater than or equal to 1. It should be noted that although the gate of the third MOS transistor M3 in the receiver shown in FIG. 1 is connected to the first resistor sub-circuits 212, actually, the gate of the third MOS transistor M3 can be connected to the distal ground terminal of any resistor of the first resistor sub-circuits 212 and the second resistor sub-circuits 213.

In this embodiment, the external signal 20b is the reference signal 10a. In this way, there is no need to set a specific external signal 20b, and the reference signal 10a can be multiplexed, so as to save the circuit area. Furthermore, since the voltages of the inverting input terminal and the non-inverting input terminal of the operational amplifier 211 are equal, if the reference signal 10a is set as the external signal 20b, the voltage value of the adjusting signal 20a is adjusted using the voltage value of the reference signal 10a as a center, the difference between the voltage values of the adjusting signal 20a and the reference signal 10a is relatively small, and the VGS adjusting of the third MOS transistor M3 is relatively less difficult. In the way, under the condition that the first MOS transistor M1 is conducted, it facilitates that the third MOS transistor M3 can be conducted and the conductive current of the third MOS transistor M3 can be fine-tuned.

In some embodiments, the receiver further includes: a control circuit 30, connected to an enable terminal of the adjusting sub-circuit 21 and configured to receive first codes 30a and a second code 30b and output an enable signal 30c, where each of the first codes 30a corresponds to one of voltage values of the reference signal 10a, the second code 30b corresponds to a preset voltage, and the enable signal 30c is used for disabling or enabling the adjusting sub-circuit 21; and if the control circuit 30 is in an enable state and a voltage value corresponding to the first code 20a is less than the preset voltage, the enable signal 30c enables the adjusting sub-circuit 21.

In some embodiments, the control circuit 30 is further configured to receive a switch signal 30d configured to disable or enable the control circuit 30. The switch signal has an enabled voltage level and a disabled voltage level. If the switch signal 30d is at the enabled voltage level, the control circuit 30 is enabled; and if the switch signal 30d is at the disabled voltage level, the control circuit 30 is disabled, where the enabled voltage level can be one of the high voltage level or low voltage level, and the disabled voltage level can be the other one of the high voltage level or low voltage level. In the present disclosure, an example that the enabled voltage level is the high voltage level and the disabled voltage level is the low voltage level is taken for illustrating.

In some embodiments, the receiver further includes: an assisting circuit 40, connected to the third MOS transistor M3 and configured to receive the enable signal 30c; if the enable signal 30c is at a first voltage level, the enable signal 30c enables the adjusting sub-circuit 21 and makes the third MOS transistor M3 to be turned on; and if the enable signal 30c is at a second voltage level, the enable signal 30c disables the adjusting sub-circuit 21 and makes the third MOS transistor M3 to be turned off.

In some embodiments, the first MOS transistor M1, the second MOS transistor M2 and the third MOS transistor M3 are Negative-channel Metal-Oxide-Semiconductor (NMOS) transistors, the first voltage level is a low voltage level and the second voltage level is a high voltage level; and the assisting circuit 40 includes: a fourth MOS transistor M4, the fourth MOS transistor M4 is an NMOS transistor, a gate of the fourth MOS transistor M4 being configured to receive the enable signal 30c, a drain of the fourth MOS transistor M4 being connected to a gate of the third MOS transistor M3, and a source of the fourth MOS being grounded. That is to say, in response to that the enable signal 30a is at the low voltage level, the adjusting sub-circuit 21 is enabled, the fourth MOS transistor M4 is turned off, and the gate of the third MOS transistor M3 is controlled by the adjusting signal 20a; and in response to that the enable signal 30c is at a high voltage level, the adjusting sub-circuit 21 is disabled, the fourth MOS transistor M4 is conducted, and the voltage of the gate of the third MOS transistor M3 is pulled down, so that the third MOS transistor M3 is turned off.

In some embodiments, the receiver further includes: a reference signal generator 40, configured to receive the first codes 30a and generate, based on the first codes 30a, a reference signal 10a having a corresponding voltage value. The reference signal 10a generated by the reference signal generator 40 can be input to at least one of the gate of the first MOS transistor M1 or the non-inverting input terminal of the operational amplifier 211.

In some embodiments, the signal receiving circuit 10 includes: a signal amplifying sub-circuit 11, including the first MOS transistor M1 and the second MOS transistor M2 and having a first output terminal (not marked) and a second output terminal (not marked), where the first output terminal is configured to output a reference amplifying signal 11a, and the second output terminal is configured to output a data amplifying signal 11b, where an absolute value of a difference between voltage values of the reference amplifying signal 11a and the data amplifying signal 11b is greater than an absolute value of a difference between voltage values of the reference signal 10a and the data signal 10b; and a data comparison sub-circuit 12, having a first input terminal configured to receive the reference amplifying signal 11a, a second input terminal configured to receive the data amplifying signal 11b, and an output terminal configured to output the comparison signal 10c.

In some embodiments, types and sizes of the first MOS transistor M1 and the second MOS transistor M2 are the same; the drain of the first MOS transistor M1 is configured to connect a first load R1; a drain of the second MOS transistor M2 is configured to connect a second load R2; and a source of the first MOS transistor M1 and a source of the second MOS transistor M2 are connected to a same current source.

In this embodiment, the third MOS transistor M3 is connected to the first MOS transistor M1 in parallel; the current passing through the third MOS transistor is controlled by the voltage value of the adjusting signal; in response to that the first MOS transistor M1 is conducted, if the third MOS transistor M3 is controlled to receive the adjusting signal, the conductive current corresponding to the reference signal 10a is changed from the conductive current of the first MOS transistor M1 per se into a sum of the conductive current of the first MOS transistor M1 and the conductive current of the third MOS transistor M3. In other words, the conductive current implemented previously by the condition that the reference signal 10a has a relatively large voltage value now can be implemented by the condition that the reference signal 10a has a relatively small voltage value. In this way, it facilitates the pulling down of the minimum value of the voltage window of the receiver for correctly recognizing the data signal, so as to enlarge the voltage window.

Accordingly, the embodiments of the disclosure further provide a memory including the receiver of any one above. The memory including the receiver above has a relatively large data recognition window, facilitating passing the RMT test during the process of the product design.

Correspondingly, the embodiments of the disclosure further provide a testing method for obtaining a voltage value of the adjusting signal to be determined. With reference to FIG. 1 to FIG. 3A and FIG. 3B, the testing method including the following steps.

At step S11, a receiver is provided and a third MOS transistor is controlled to be turned off.

By controlling the third MOS transistor M3 to be turned off, an initial data recognition window of the signal receiving circuit 10 can be detected. The data recognition window refers to a condition that representing data signal 10b obtained by scanning the reference signal 10a can be correctly recognized in a case that a wave form of the data signal 10b is fixed. Generally, a shmoo diagram is used for representing the data recognition window, where TxV+ is used for representing the maximum voltage value of the data recognition window, and TxV− is used for representing the minimum voltage value of the data recognition window.

In addition, the operation of scanning the reference signal 10a refers to adjusting the voltage values of the reference signal 10a according to a specific step length in an ascending order or a descending order.

At step S12, a data signal is input to a signal receiving circuit and according a first step length, a voltage value of a reference signal is adjusted to obtain comparison signals designated as first comparison signals.

Each comparison signal 10c is used for representing a magnitude relationship between a voltage value of the reference signal 10a and the voltage value of the data signal 10b; during the process of scanning the reference signal 10a, multiple comparison signals 10c can be obtained, i.e., multiple first comparison signals. Due to reasons such as the wave form integrity of the data signal 10b and the resolution of the signal receiving circuit, a part of the comparison signals 10c cannot be used to correctly represent the magnitude relationship between the voltage values of the data signal 10b and the reference signal 10a, and merely a part of the comparison signals 10c can correctly be used to represent the magnitude relationship, in the present disclosure, if the magnitude relationship represented by the comparison signals 10c is the same as the magnitude relationship between the data signal 10b and the reference signal 10a, where the comparison signals are taken as effective signals.

At S13, a voltage value range, designated as a first voltage value range, of the reference signal corresponding to all of the effective signals of the first comparison signals is obtained; and an intermediate value and a minimal value of the first voltage value range are obtained, and where minimal value is taken as a first minimal value.

Figure 3A:
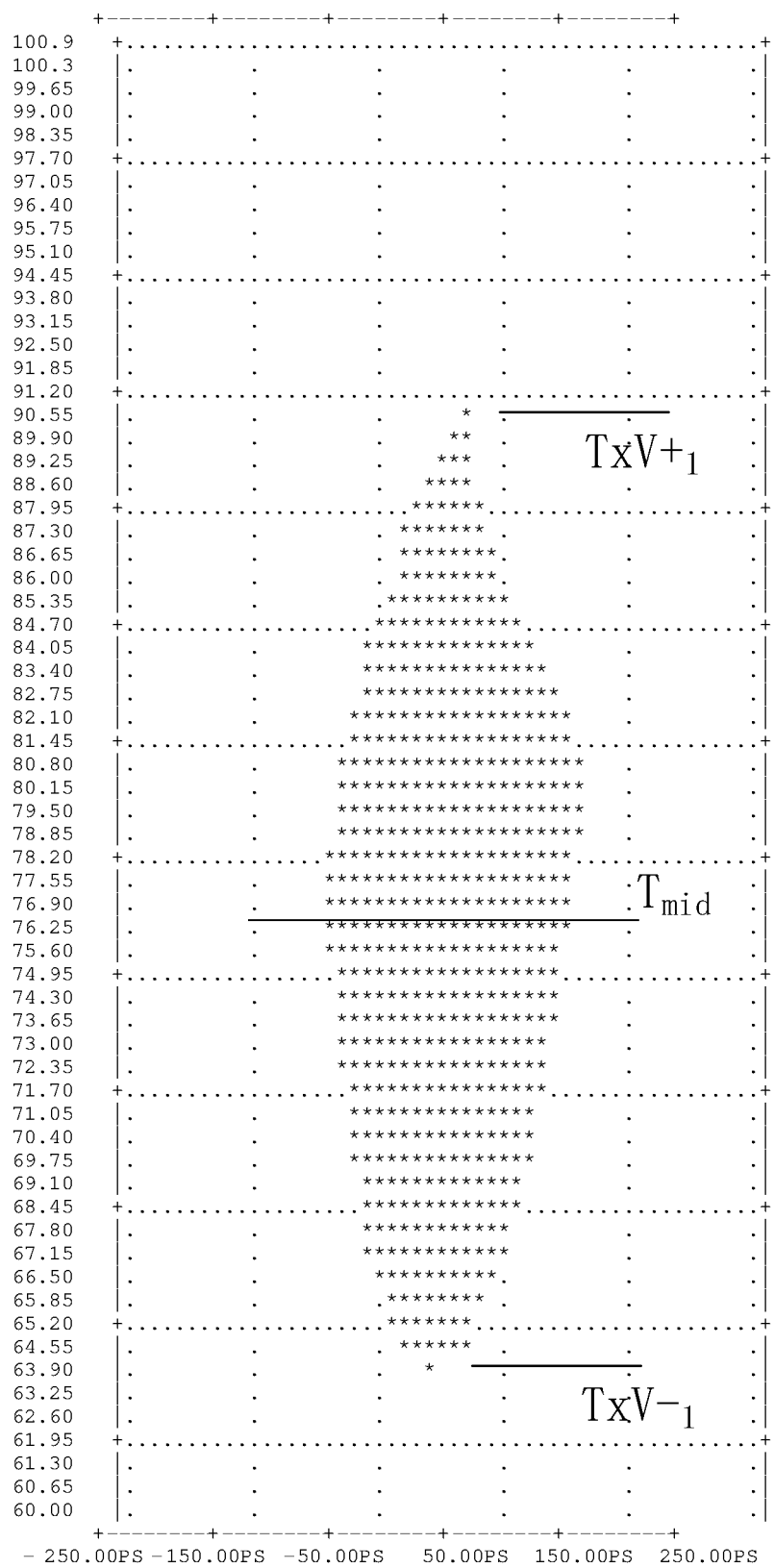
FIG. 3A is a first shmoo diagram according to an embodiment of the present disclosure.

The comparison signals 10c are generated based on the reference signal 10a and the data signal 10b, each comparison signal 10c has a corresponding reference signal 10a, and the voltage value range of the reference signal 10a corresponding to the effective signals of the comparison signals constitutes the shmoo diagram. In a case where the third MOS transistor M3 is to be turned off while the reference signal 10a is scanned, the obtained shmoo diagram represents the initial data recognition window of the signal receiving circuit 10. With reference to FIG. 3A, the initial data recognition window has a maximal value designated as a first maximal value $TxV_{+1}$, an intermediate value $T_{mid}$ and a minimal value designated a first minimal value $TxV_{-1}$.

At step S14, the data signal is input to the signal receiving circuit and according to the first step length, a voltage value of the reference signal is adjusted and in response to that the voltage value of the reference signal is less than or equal to the intermediate value, an adjusting signal is input to make the third MOS transistor to be turned on, to obtain multiple comparison signals designated as second comparison signals.

During the process of obtaining the second comparison signals, the wave form of the data signal 10b is fixed, the third MOS transistor M3 is controlled to be turned on only when the voltage value of the reference signal 10a is less than or equal to the intermediate value $T_{mid}$, which facilitate preventing the setting of the third MOS transistor M3 from simultaneously pulling down the maximal value and minimal value of the data recognition window, i.e., the first maximal value TxV+1 and the first minimal value $TxV_{-1}$, so that the setting of the third MOS transistor M3 only pulls down the first minimal value $TxV_{-1}$, thereby enlarging the voltage range of the data recognition window.

At step S15, a voltage value range, designated as a second voltage value range, of the reference signal corresponding to all of the effective signals of the second comparison signals is obtained; and a minimum value of the second voltage value range is obtained, where the minimum value is taken as a second minimal value.

Figure 3B:
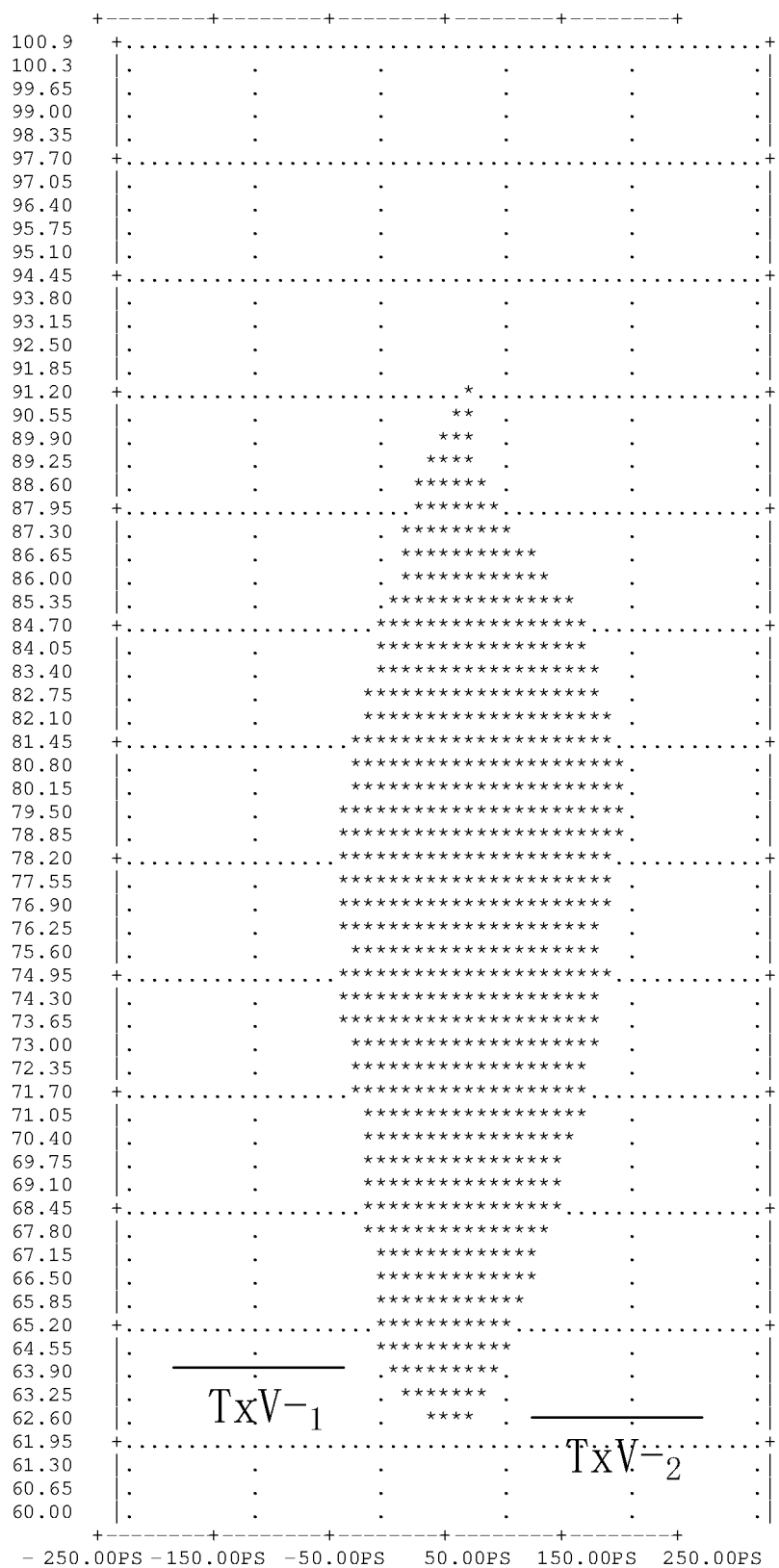
FIG. 3B is a second shmoo diagram according to an embodiment of the present disclosure.

The purposes of this step are to verify whether the setting of the adjusting signal implements the pulling down of the voltage minimal value in the data recognition window and to measure the relationship between the voltage magnitude of the adjusting signal and a pull-down amplitude. If the minimal value of the data recognition window shown in FIG. 3B is further pulled down to a second minimal value $TxV_{-2}$, it is determined that the minimal value in the data recognition window is further pulled down. In addition, the pull-down amplitude may be the voltage difference or may also be a proportion value. The voltage difference may be obtained through calculation that the first minimal value $TxV_{-1}$ minus the second minimal value $TxV_{-2}$. The proportion value may be obtained through calculation of dividing the difference between the first minimal value $TxV_{-1}$ and the second minimal value $TxV_{-2}$ by the difference between the first maximal value $TxV_{+1}$ and the first minimal value $TxV_{-1}$. The present disclosure is explained by taking the pull-down amplitude as the voltage difference.

In some embodiments, the voltage value of the adjusting signal 20a needs to be controlled, so that the difference between the pulled down minimal value and the first minimal value $TxV_{-1}$ is greater than or equal to the preset threshold. Hence, after the second minimal value $TxV_{-2}$ is obtained, the following steps S16 to S19 is further included.

At step S16, it is determined whether a difference between a second minimal value $TxV_{-2}$ and a first minimal value $TxV_{-1}$ is greater than or equal to a preset threshold.

If the difference is greater than or equal to the preset threshold, it is indicated that the current voltage value of the adjusting signal 20a meets the requirements, and the current voltage value of the adjusting signal 20a is recorded and the testing procedure is ended; if the difference is less than the preset threshold, the operation of adjusting the voltage value of the adjusting signal 20a is required to further pull down the voltage minimal value of the data recognition window, i.e., the step S17 is performed.

At step S17, according a second step length, a voltage value of an adjusting signal is adjusted to obtain a comparison signal designated as an $N^{th}$ Comparison signal.

After the voltage value of the adjusting signal 20a once is adjusted according to the second step length, the data signal 10b is input to the signal receiving circuit 10, and according to the first step length, the voltage value of the reference signal 10a is adjusted to obtain the corresponding comparison signals 10c designated as the $N^{th}$ comparison signals, where N is a natural number greater than or equal to 3, and the numeral value of N is increased as the increasing of the adjusting times of the adjusting signal 20a. That is to say, every time when adjusting the voltage value of the adjusting signal 20a once according to the second step length, it requires to rescan the voltage value of the reference signal 10a once (assuming that the wave form of the data signal 10b is fixed and continuously input).

The second step can be a positive value or a negative value. That is to say, the voltage values of the adjusting signal 20a may be adjusted according to a descending trend, or may also be adjusted according to an ascending trend. In the embodiments of the disclosure, the voltage values of the adjusting signal 20a are adjusted according to the ascending trend. In this way, before the voltage value of the adjusting signal 20a meets the requirements, the conductive current of the third MOS transistor M3 is relatively small, ensuring that the third MOS transistor M3 only has a fine-tuning function.

In addition, the adjustment of the voltage value of the adjusting signal 20a is irrelevant to the input time of the adjusting signal 20a. During the process of scanning the voltage value of the reference signal 10a, the adjusting signal 20a is always input to the gate of the third MOS transistor M3 in a case that the voltage value of the reference signal 10a is less than or equal to the intermediate value $T_{mid}$. Specifically, taking the receiver shown in FIG. 1 as an example, after the voltage value of the adjusting signal 20a does not meet the requirements, the operational amplifier 211 is disabled, and the output of the adjusting signal 20a is suspended. The variable resistant sub-circuit controls, according to a new adjusting code 20c, the gate of the third MOS transistor M3 to be connected to the distal ground terminal of the other resistor. The new adjusting code 20c corresponds to the voltage value of the adjusting signal 20a adjusted according to the second step length. After the connection relationship of the third MOS transistor M3 is adjusted, the voltage value of the reference signal 10a is rescanned, and when the voltage value of the reference signal 10a is less than or equal to the intermediate value $T_{mid}$, the operational amplifier 211 is enabled. At this time, the adjusting sub-circuit 21 outputs, according to the new adjusting code 20c, a new adjusting signal 20a, to obtain the comparison signals 10c.

At step S18, a voltage value range, designated as an NW voltage value range, of the reference signal corresponding to all of the effective signals of the $N^{th}$ Comparison signals is obtained; and a minimum value of the NW voltage value range is obtained, where the minimum value is taken as an NW minimal value.

The step S18 is similar to step S16 used for verifying whether the voltage value adjustment in the previous step can meet the requirements, i.e., whether a difference between a first minimal value $TxV_{-1}$ and an $N^{th}$ minimal value is greater than or equal to a preset threshold.

At step S19, it is determined whether a difference between the first minimal value and the NW minimal value is greater than or equal to the preset threshold.

If the difference is greater than or equal to the preset threshold, it is indicated that the voltage value of the adjusting signal 20a corresponding to the $N^{th}$ comparison signals meets the requirements, and the current voltage value of the adjusting signal 20a can be recorded and the test is ended. If the difference is less than the threshold, steps S17 and S18 are circulated, i.e., the voltage value of the adjusting signal 20a is adjusted repeatedly according to the second step length until the difference between the $N^{th}$ minimal value corresponding to the $N^{th}$ comparison signals and the first minimal value $TxV_{-1}$ is greater than or equal to the preset threshold.

Figure 4:
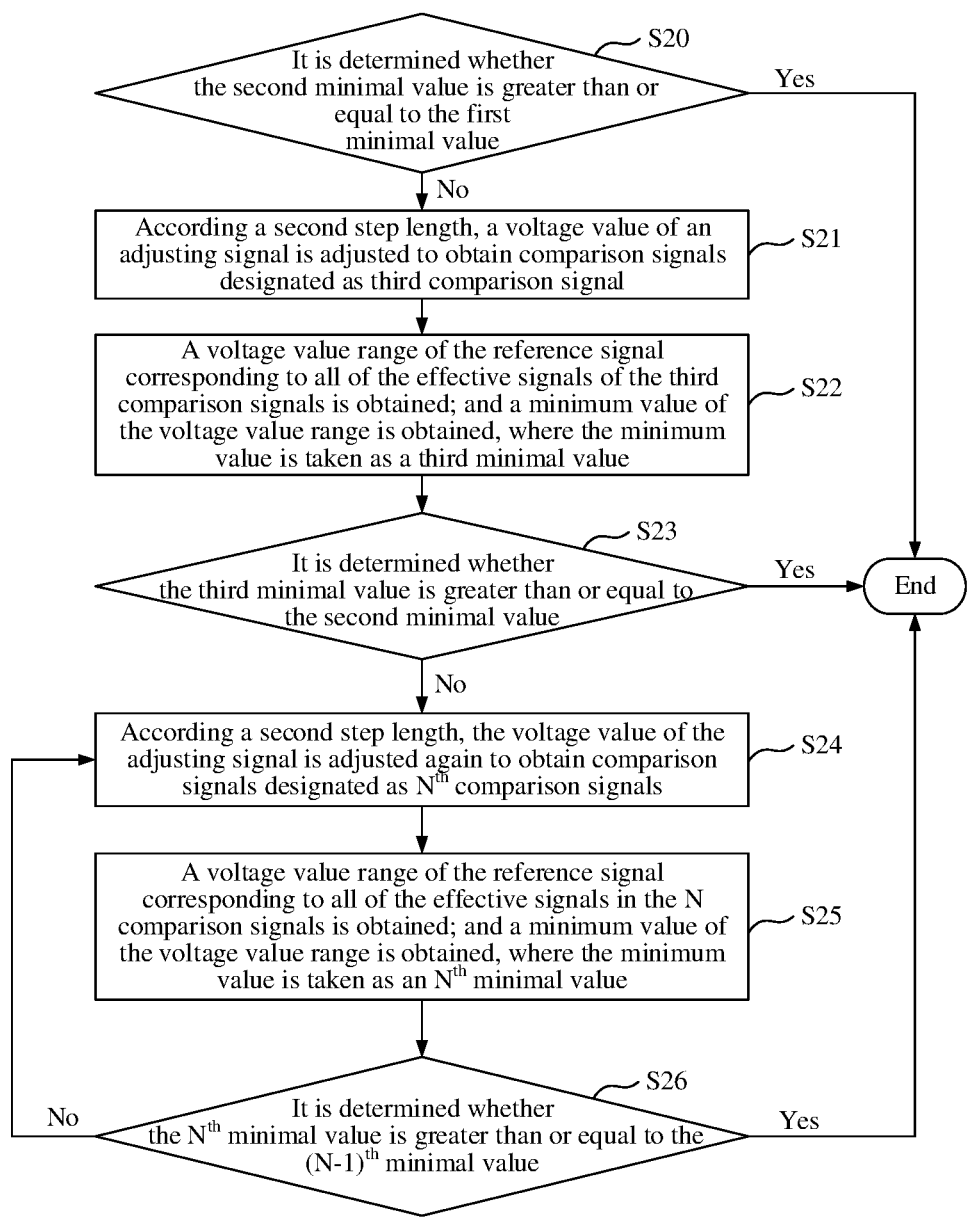
FIG. 4 is another testing method according to an embodiment of the present disclosure.

In some embodiments, the voltage value of the adjusting signal 20a is required to be adjusted so that the data recognition window has the minimal value that is smallest. Specifically, if the minimal value of the data recognition window is greater than or equal to the preceding minimal value after the voltage value of the adjusting signal 20a is adjusted, it is considered that the preceding minimal value has reached a limit value and cannot be further pulled down. Furthermore, although theoretically, the second minimal value $TxV_{-2}$ is smaller than the first minimal value $TxV_{-1}$, to improve the accuracy of the test, it is required to verify the actual voltage value of the second minimal value $TxV_{-2}$. Hence, after the second minimal value $TxV_{-2}$ is obtained, with reference to FIG. 4, the following steps S20 to S26 is required to be executed.

At step S20, it is determined whether the second minimal value is greater than or equal to the first minimal value.

If the second minimal value $TxV_{-2}$ is greater than or equal to the first minimal value $TxV_{-1}$, it indicates that the setting of the adjusting signal 20a does not work. At this time, the test is suspended and reasons are detected. If the second minimal value $TxV_{-2}$ is less than the first minimal value $TxV_{-1}$, it indicates that the setting of the adjusting signal 20a can work normally. At this time, it is required to detect whether the second minimal value $TxV_{-2}$ is a limit value of the minimal value of the data recognition window.

At step S21, according a second step length, a voltage value of an adjusting signal is adjusted to obtain comparison signals designated as third comparison signals.

At step S22, a voltage value range of the reference signal corresponding to all of the effective signals of the third comparison signals is obtained; and a minimum value of the voltage value range is obtained, where the minimum value is taken as a third minimal value.

Step S21 and step S22 are used for obtaining a third minimal value; through the magnitude relationship between the third minimal value and the second minimal value $TxV_{-2}$, it can be determined whether the second minimal value $TxV_{-2}$ is a limit value of the minimal value.

At step S23, it is determined whether the third minimal value is greater than or equal to the second minimal value $TxV_{-2}$.

If the third minimal value is greater than or equal to the second minimal value $TxV_{-2}$, it is considered that the minimal value of the data recognition window cannot be further pulled down, and the second minimal value $TxV_{-2}$ is in the limit value of the minimal value. If the third minimal value is less than the second minimal value $TxV_{-2}$, it indicates that there is also a space for the minimal value of the data recognition window to be further pulled down, and at this time, the voltage value of the adjusting signal 20a is required to be further adjusted according to the second step length until the $N^{th}$ minimal value corresponding to the $N^{th}$ comparison signals is greater than or equal to the $(N-1)^{th}$ minimal value, where N is a natural number greater than or equal to 4.

The specific steps are as follows. At step S24, according to a second step length, the voltage value of the adjusting signal is adjusted again to obtain comparison signals designated as $N^{th}$ comparison signals. At step S25, a voltage value range of the reference signal corresponding to all of the effective signals in the N comparison signals is obtained; and a minimum value of the voltage value range is obtained, where the minimum value is taken as an $N^{th}$ minimal value.

At step S26, it is determined whether the $N^{th}$ minimal value is greater than or equal to the $(N-1)^{th}$ minimal value; if the $N^{th}$ minimal value is greater than or equal to the $(N_{-1})^{th}$ minimal value, it indicates that the $(N-1)^{th}$ minimal value is the limit value of the minimal value, and at this time, the voltage value of the adjusting signal 20a is recorded and the test is ended; and if the $N^{th}$ minimal value is less than the $(N-1)^{th}$ minimal value, it indicates that the minimal value of the data recognition window can be further pulled down, at this time, steps S24 to S26 are performed repeatedly until the $N^{th}$ minimal value is greater than or equal to the $(N-1)^{th}$ minimal value, and at this time, it is considered that the $(N-1)^{th}$ minimal value is a limit minimal value of the data recognition window.

This embodiment provides a testing method, for testing the influence of the setting of the adjusting signal on the minimal value of the data recognition window, in other words, the influence whether the setting of the adjusting signal expand the voltage value range of the data recognition window is tested, the voltage value of the adjusting signal meeting data recognition window voltage value range requirements is determined, and it is ensured that the receiver has a relatively large data recognition window.

One of ordinary skill in the art can understand that each embodiment is a specific embodiment implementing the disclosure, and in practical applications, various variations about the form and details can be made thereto without departing from the spirit and scope of the disclosure. Those skilled in the art may make respective alterations and modifications without departing from the spirit and scope of the present disclosure, so the protection scope of the disclosure is subject to the protection scope in claims.

INDUSTRIAL APPLICABILITY

In the embodiments of the disclosure, the receiver includes: a signal receiving circuit, including a first MOS transistor and a second MOS transistor, where a gate of the first MOS transistor is configured to receive a reference signal and a gate of the second MOS transistor is configured to receive a data signal, and the signal receiving circuit is configured to output a comparison signal, the comparison signal being configured to represent a magnitude relationship between a voltage value of the reference signal and a voltage value of the data signal; and an adjusting circuit, including a third MOS transistor, where a source of the third MOS transistor is connected to a source of the first MOS transistor, a drain of the third MOS transistor is connected to a drain of the first MOS transistor, and a gate of the third MOS transistor is configured to receive an adjusting signal. The embodiments of the disclosure facilitate to enlarge the range of an effective recognition window of the data signal.

What is claimed is:

1. A receiver, comprising:
a signal receiving circuit, comprising a first Metal-Oxide-Semiconductor (MOS) transistor and a second MOS transistor, wherein a gate of the first MOS transistor is configured to receive a reference signal and a gate of the second MOS transistor is configured to receive a data signal, and the signal receiving circuit is configured to output a comparison signal, the comparison signal being configured to represent a magnitude relationship between a voltage value of the reference signal and a voltage value of the data signal; and
an adjusting circuit, comprising a third MOS transistor, wherein a source of the third MOS transistor is connected to a source of the first MOS transistor, a drain of the third MOS transistor is connected to a drain of the first MOS transistor, and a gate of the third MOS transistor is configured to receive an adjusting signal;
wherein the adjusting circuit further comprises: an adjusting sub-circuit, configured to receive an external signal and adjusting codes to output the adjusting signal, wherein the external signal is used for generating the adjusting signal, and each of the adjusting codes corresponds to a respective voltage value of the adjusting signal.

2. The receiver of claim 1, wherein a ratio between a width-to-length ratio of the first MOS transistor and a width-to-length ratio of the third MOS transistor is greater than 4.

3. The receiver of claim 1, wherein the adjusting sub-circuit comprises:
an operational amplifier and a plurality of resistors connected in series, wherein the operational amplifier has a non-inverting input terminal, an inverting input terminal and an output terminal, the non-inverting input terminal being configured to receive the external signal, a first number of resistors are connected in series between the inverting input terminal and the output terminal, and a second number of resistors are connected in series between the inverting input terminal and a ground terminal; and
a variable resistance sub-circuit, configured to receive the adjusting codes and control, according to the adjusting codes, the gate of the third MOS transistor to be connected to a distal ground terminal of one of the first or second number of resistors.

4. The receiver of claim 1, wherein the external signal is the reference signal.

5. The receiver of claim 1, further comprising:
a control circuit, connected to an enable terminal of the adjusting sub-circuit and configured to receive first codes and a second code and output an enable signal, wherein each of the first codes corresponds to one of voltage values of the reference signal, the second code corresponds to a preset voltage, and the enable signal is used for disabling or enabling the adjusting sub-circuit; and in response to that the control circuit is in an enable state and a voltage value corresponding to the first code is less than the preset voltage, the enable signal enables the adjusting sub-circuit.

6. The receiver of claim 5, wherein the control circuit is further configured to receive a switch signal configured to disable or enable the control circuit.

7. The receiver of claim 5, further comprising:
an assisting circuit, connected to the gate of the third MOS transistor and configured to receive the enable signal; in response to that the enable signal is at a first voltage level, the enable signal enables the adjusting sub-circuit and makes the third MOS transistor to be turned on; and in response to that the enable signal is at a second voltage level, the enable signal disables the adjusting sub-circuit and makes the third MOS transistor to be turned off.

8. The receiver of claim 7, wherein the first MOS transistor, the second MOS transistor and the third MOS transistor are Negative-channel Metal-Oxide-Semiconductor (NMOS) transistors, the first voltage level is a low voltage level and the second voltage level is a high voltage level; and the assisting circuit comprises: a fourth MOS transistor, the fourth MOS transistor is an NMOS transistor, a gate of the fourth MOS transistor being configured to receive the enable signal, a drain of the fourth MOS being connected to the gate of the third MOS transistor, and a source of the fourth MOS being grounded.

9. The receiver of claim 5, further comprising: a reference signal generator, configured to receive the first codes and generate, based on the first codes, a reference signal having a corresponding voltage value.

10. The receiver of claim 1, wherein the signal receiving circuit comprises:
a signal amplifying sub-circuit, comprising the first MOS transistor and the second MOS transistor and having a first output terminal and a second output terminal, wherein the first output terminal is configured to output a reference amplifying signal, and the second output terminal is configured to output a data amplifying signal, wherein an absolute value of a difference between voltage values of the reference amplifying signal and the data amplifying signal is greater than an absolute value of a difference between voltage values of the reference signal and the data signal; and
a data comparison sub-circuit, having a first input terminal configured to receive the reference amplifying signal, a second input terminal configured to receive the data amplifying signal, and an output terminal configured to output the comparison signal.

11. The receiver of claim 9, wherein types and sizes of the first MOS transistor and the second MOS transistor are the same; the drain of the first MOS transistor is configured to connect a first load; a drain of the second MOS transistor is configured to connect a second load; and the source of the first MOS transistor and a source of the second MOS transistor are connected to a same current source.

12. A memory, comprising a receiver, wherein the receiver comprises:
a signal receiving circuit, comprising a first Metal-Oxide-Semiconductor (MOS) transistor and a second MOS transistor, wherein a gate of the first MOS transistor is configured to receive a reference signal and a gate of the second MOS transistor is configured to receive a data signal, and the signal receiving circuit is configured to output a comparison signal, the comparison signal being configured to represent a magnitude relationship between a voltage value of the reference signal and a voltage value of the data signal; and
an adjusting circuit, comprising a third MOS transistor, wherein a source of the third MOS transistor is connected to a source of the first MOS transistor, a drain of the third MOS transistor is connected to a drain of the first MOS transistor, and a gate of the third MOS transistor is configured to receive an adjusting signal;
wherein the signal receiving circuit comprises:
a signal amplifying sub-circuit, comprising the first MOS transistor and the second MOS transistor and having a first output terminal and a second output terminal, wherein the first output terminal is configured to output a reference amplifying signal, and the second output terminal is configured to output a data amplifying signal, wherein an absolute value of a difference between voltage values of the reference amplifying signal and the data amplifying signal is greater than an absolute value of a difference between voltage values of the reference signal and the data signal; and
a data comparison sub-circuit, having a first input terminal configured to receive the reference amplifying signal, a second input terminal configured to receive the data amplifying signal, and an output terminal configured to output the comparison signal.

13. A testing method, comprising:
providing a receiver, wherein the receiver comprises a signal receiving circuit comprising a first Metal-Oxide-Semiconductor (MOS) transistor and a second MOS transistor, and an adjusting circuit comprising a third MOS transistor;
controlling the third MOS transistor to be turned off;
inputting a data signal to a signal receiving circuit and adjusting, according a first step length, a voltage value of a reference signal to obtain a plurality of comparison signals designated as first comparison signals, wherein in response to that a magnitude relationship represented by the comparison signals is the same as a magnitude relationship between the data signal and the reference signal, wherein the comparison signals are taken as effective signals;
obtaining a voltage value range, designated as a first voltage value range, of the reference signal corresponding to all of the effective signals of the first comparison signals; and obtaining an intermediate value and a minimal value of the first voltage value range, wherein the minimal value is taken as a first minimal value;
inputting the data signal to the signal receiving circuit and adjusting, according to the first step length, a voltage value of the reference signal and in response to that the voltage value of the reference signal is less than or equal to the intermediate value, inputting an adjusting signal to make the third MOS transistor to be turned on, to obtain a plurality of comparison signals designated as second comparison signals; and
obtaining a voltage value range, designated as a second voltage value range, of the reference signal corresponding to all of the effective signals of the second comparison signals; and obtaining a minimum value of the second voltage value range, wherein the minimum value is taken as a second minimal value.

14. The testing method of claim 13, in response to that a difference between the second minimal value and the first minimal value is less than a preset threshold, adjusting, according to a second step length, a voltage value of the adjusting signal, until a difference between an $N^{th}$ minimal value corresponding to an $N^{th}$ comparison signal and the first minimal value is greater than or equal to the preset threshold, where N is a natural number greater than or equal to 3.

15. The testing method of claim 13, after the second minimal value is obtained, adjusting, according to the second step length, a voltage value of the adjusting signal to obtain the comparison signals designated as third comparison signals; and
obtaining a voltage value range, designated as a third voltage value range, of the reference signal corresponding to all of the effective signals of the third comparison signals; and obtaining a minimum value of the third voltage value range, wherein the minimum value is taken as a third minimal value; in response to that the third minimal value is greater than or equal to the second minimal value, recording the voltage value of the adjusting signal and ending testing; and in response to that the third minimal value is less than the second minimal value, adjusting again, according to the second step length, the voltage value of the adjusting signal until an $N^{th}$ minimal value corresponding to an $N^{th}$ comparison signal is greater than or equal to the $(N-1)^{th}$ minimal value, where N is a natural number greater than or equal to 4.

* * * * *